United States Patent [19]

Ishimura

[11] Patent Number: 5,684,307

[45] Date of Patent: Nov. 4, 1997

[54] SEMICONDUCTOR PHOTODIODE HAVING THE ELECTRODES FORMED ON THE SAME SURFACE

[75] Inventor: Eitaro Ishimura, Tokyo, Japan

[73] Assignee: Mitsubishi Denki Kabushiki Kaisha, Tokyo, Japan

[21] Appl. No.: 548,876

[22] Filed: Oct. 26, 1995

[30] Foreign Application Priority Data

May 8, 1995 [JP] Japan .................................. 7-109732

[51] Int. Cl.$^6$ ................................................ H01L 31/0328
[52] U.S. Cl. ...................... 257/184; 257/436; 257/437; 257/458; 257/459
[58] Field of Search ..................... 257/21, 22, 431, 257/434, 436, 437, 457, 458, 459, 460, 466, 184, 615

[56] References Cited

U.S. PATENT DOCUMENTS 4,947,400  8/1990  Dutta ............................ 257/184

OTHER PUBLICATIONS

Makiuchi et al, "Planar Type InGaAs/InP–Pin Photodiode", Spring National Convention Record, The Institute of Electronics, Information and Communication Engineers, vol. 4, 1991, p. 201.

Primary Examiner—Minh-Loan Tran
Attorney, Agent, or Firm—Leydig, Voit & Mayer, Ltd.

[57] ABSTRACT

A semiconductor optical device having a small difference in level between first and second electrodes includes, at a first electrode, a junction of a p-type contact and an electron trapping semi-insulating semiconductor region in an n-type semiconductor substrate which is rectifying. At the second electrode, a diode includes a p-type window region, a light absorption region, and the n-type semiconductor substrate. When light enters this diode, a photocurrent is generated. When a bias voltage is applied to the diode in a reverse direction, the photocurrent flows between the electrodes.

6 Claims, 7 Drawing Sheets

FIGURE 12 (a) Prior Art
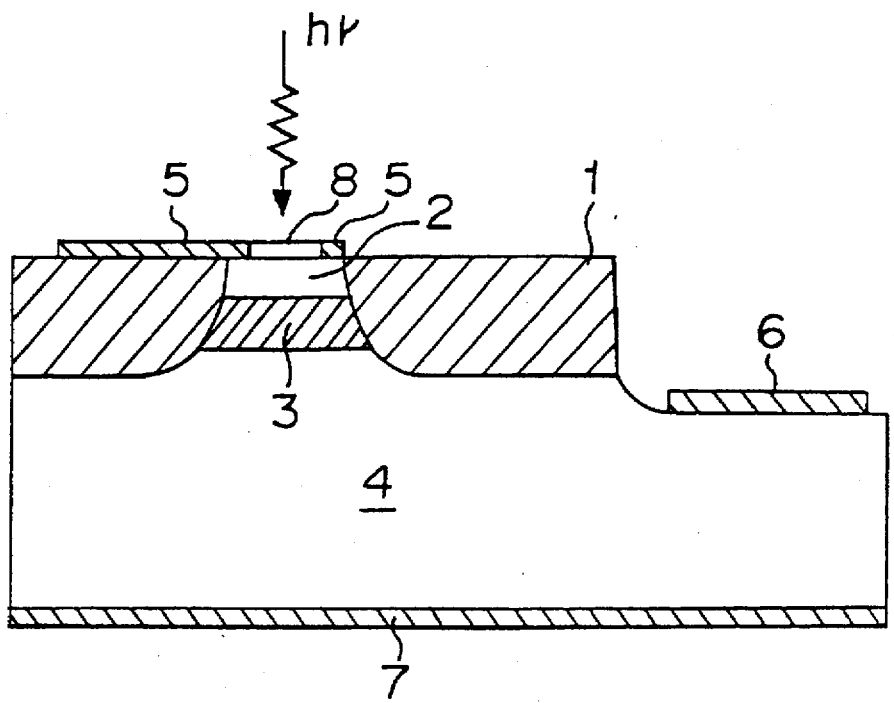
FIGURE 12 (b) Prior Art
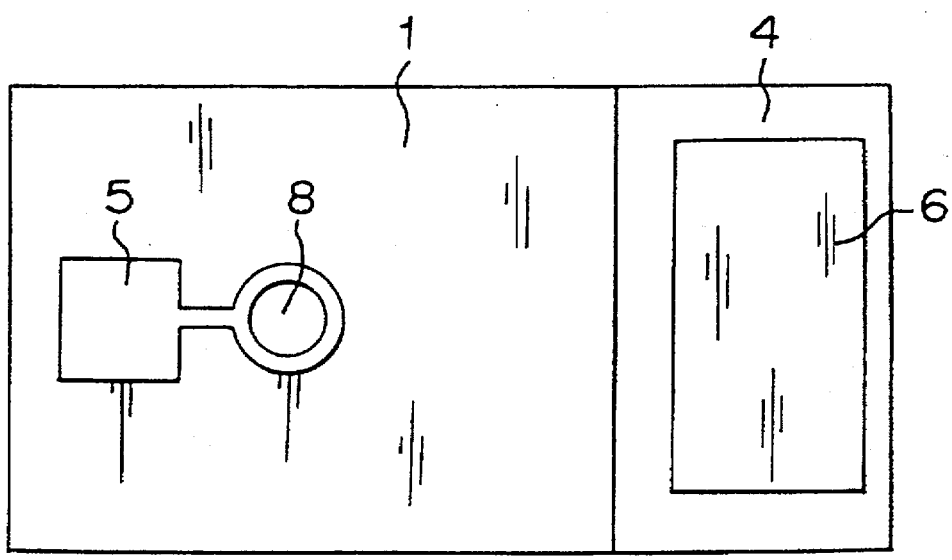

5,684,307

SEMICONDUCTOR PHOTODIODE HAVING THE ELECTRODES FORMED ON THE SAME SURFACE

BACKGROUND OF THE INVENTION

1. Field of the Invention

The present invention relates to a semiconductor optical device having a semi-insulating semiconductor layer, a photodiode, a modulator and a semiconductor laser device incorporating the semiconductor optical device.

2. Discussion of Background

FIG. 12(a) is a sectional view of a conventional photodiode having a semi-insulating semiconductor layer, and FIG. 12(b) is a plan view of the photodiode having a conventional semi-insulating semiconductor layer. In the Figures, a numerical reference 1 designates a semi-insulating semiconductor layer made of InP layer doped with Fe. A numerical reference 2 designates a window layer made of p-type InP. A numerical reference 3 designates a light absorption layer made of intrinsic-InGaAs. A numerical reference 4 designates an n-type InP substrate. A numerical reference 5 designates an anode-side electrode made of Ti/Au. A numerical reference 6 designates a cathode-side electrode made of AuGe/Au. A numerical reference 7 designates a substrate-side electrode made of AuGe/Au. A numerical reference 8 designates an anti-reflection film made of $Si_3N_4$. A reference designates incident light.

The incident light hv passes through the anti-reflection film 8 and the window layer 2, and is absorbed in the light absorption layer 3. A current resulting from the light absorption is output through the anode-side electrode 5 and the cathode-side electrode 6. In the conventional structure, both the electrodes 5 and 6 at the anode-side and the cathode-side are provided on a front surface of the device. The arrangement of the electrodes on the front surface facilitates wiring to external circuit elements.

In the conventional photodiode, it was necessary to remove a portion of the semi-insulating semiconductor layer 1 by etching in order to locate the cathode-side electrode in that portion. The portion was in a recessed form having a step as large as 5 μm. The existence of the step caused a problem of uneven coating by a resist.

SUMMARY OF THE INVENTION

The present invention is to solve the above-mentioned problems inherent to the prior art.

It is an object of the present invention to provide a semiconductor optical device having a small difference in height between a portion on which an electrode at an anode-side is provided and a portion on which an electrode at a cathode-side is provided, whereby succeeding processing and mounting are easy.

According to the present invention, there is provided a semiconductor optical device comprising a light absorption layer provided on a portion of an n-type semiconductor substrate, a p-type window layer formed on the light absorption layer, an electron trapping type semi-insulating semiconductor layer formed on the n-type semiconductor substrate so that the light absorption layer and the p-type window layer are embedded, a p-type contact layer formed on a portion of the semi-insulating semiconductor layer, a cathode-side electrode provided on the p-type contact layer, and an anode-side electrode formed on the p-type window layer and the semi-insulating semiconductor layer, wherein the cathode-side electrode and the anode-side electrode are substantially flush.

According to the present invention, there is provided a semiconductor optical device comprising a light absorption layer provided on a portion of a p-type semiconductor substrate, an n-type window layer formed on the light absorption layer, an electron trapping type semi-insulating semiconductor layer formed on the p-type semiconductor substrate so that the light absorption layer and the n-type window layer are embedded, an n-type contact layer formed on a portion of the semi-insulating semiconductor layer, an anode-side electrode provided on the n-type contact layer, and a cathode-side electrode formed on the n-type window layer and the semi-insulating semiconductor layer, wherein the cathode-side electrode and the anode-side electrode are substantially flush.

Each of the semi-insulating semiconductor layers is an InP layer doped with Fe, an InP layer doped with Co or an InP layer doped with V.

A photodiode according to the present invention utilizes the above-mentioned semiconductor optical device, wherein light enters from the side of the window layer.

Further, the photodiode may be so constructed that light enters from the back side of the semiconductor substrate.

A modulator according to the present invention utilizes the above-mentioned semiconductor optical device, wherein the light absorption layer has a multiple quantum well structure, whereby light incident from the window layer side is modulated in the light absorption layer and the modulated light is emitted from the back surface of the semiconductor substrate.

Another semiconductor optical device according to the present invention comprises an active layer formed on a portion of an n-type semiconductor substrate, a p-type cladding layer formed on a portion of the active layer, a hole trapping type semi-insulating semiconductor layer formed on the n-type semiconductor substrate so as to embed the active layer and the p-type cladding layer, an n-type contact layer formed on a portion of the semi-insulating semiconductor layer, an anode-side electrode provided on the n-type contact layer and a cathode-side electrode provided on the p-type cladding layer, wherein the electrodes at the anode and cathode/sides are substantially flush.

Another semiconductor optical device according to the present invention comprises an active layer formed on a portion of a p-type semiconductor substrate, an n-type cladding layer formed on a portion of the active layer, a hole trapping type semi-insulating semiconductor layer formed on the p-type semiconductor substrate so as to embed the active layer and the n-type cladding layer, a p-type contact layer formed on a portion of the semi-insulating semiconductor layer, a cathode-side electrode provided on the p-type contact layer and an anode-side electrode provided on the n-type clad layer, wherein the electrodes at the cathode and anode-sides are substantially flush.

Further, the semi-insulating semiconductor layer is either an InP layer doped with Cr or an InP layer doped with Ti.

A semiconductor laser device according to the present invention utilizes the above-mentioned semiconductor optical devices.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 12(a) is a cross-sectional view showing a conventional photodiode; and

FIG. 12(b) is a plan view of the conventional photodiode.

DETAILED DESCRIPTION OF THE PREFERRED EMBODIMENTS

The present invention will be described in more detail. A semiconductor optical device according to the present invention has a junction comprising a p-type contact layer, an electron trapping semi-insulating semiconductor layer and an n-type semiconductor substrate at the side of a cathode electrode. This junction has the same rectifying characteristics as a diode because of the electron trapping semi-insulating semiconductor which allows holes to flow but prohibits electrons from flowing. Therefore, when light enters into a diode having a p-type window layer, a light absorption layer, and an n-type semiconductor substrate, a photo current is generated. In this case, when a bias voltage is applied to the device in a reverse direction, the photo current flows from the cathode-side electrode to the anode-side electrode as a function of the semiconductor optical device. Further, the cathode-side electrode and the anode-side electrode are located at substantially the same level. Accordingly, unevenness of the surface of the device is eliminated, and the succeeding processing and mounting are easy.

At the side of an anode-side electrode, there is a junction comprising an n-type contact layer, an electron trapping semi-insulating semiconductor layer and a p-type semiconductor substrate. This junction shows the same rectifying characteristics as that of a diode because of the electron trapping semi-insulating semiconductor which allows holes to flow but prohibits electrons from flowing. Therefore, when light enters into a diode having an n-type window layer, a light absorption layer, and a p-type semiconductor substrate, a photo current is generated. In this case, when a bias voltage is applied to the device in a reverse direction, the photo current flows from the cathode-side electrode to the anode-side electrode as a function of a semiconductor optical device.

Further, when a hole trapping semi-insulating semiconductor layer is used and a bias voltage is applied to the device in a forward direction, holes are introduced from a p-type cladding layer to an active layer without leaking into the hole trapping semi-insulating semiconductor layer. Thus, a photo current flows from the cathode-side electrode to the anode-side electrode in as the semiconductor optical device.

Now, preferred embodiments of the present invention will be described in detail with reference to the drawings wherein the same numerical references are used for the same or the similar portions and description of these portions is omitted.

Embodiment 1

Figure 1:
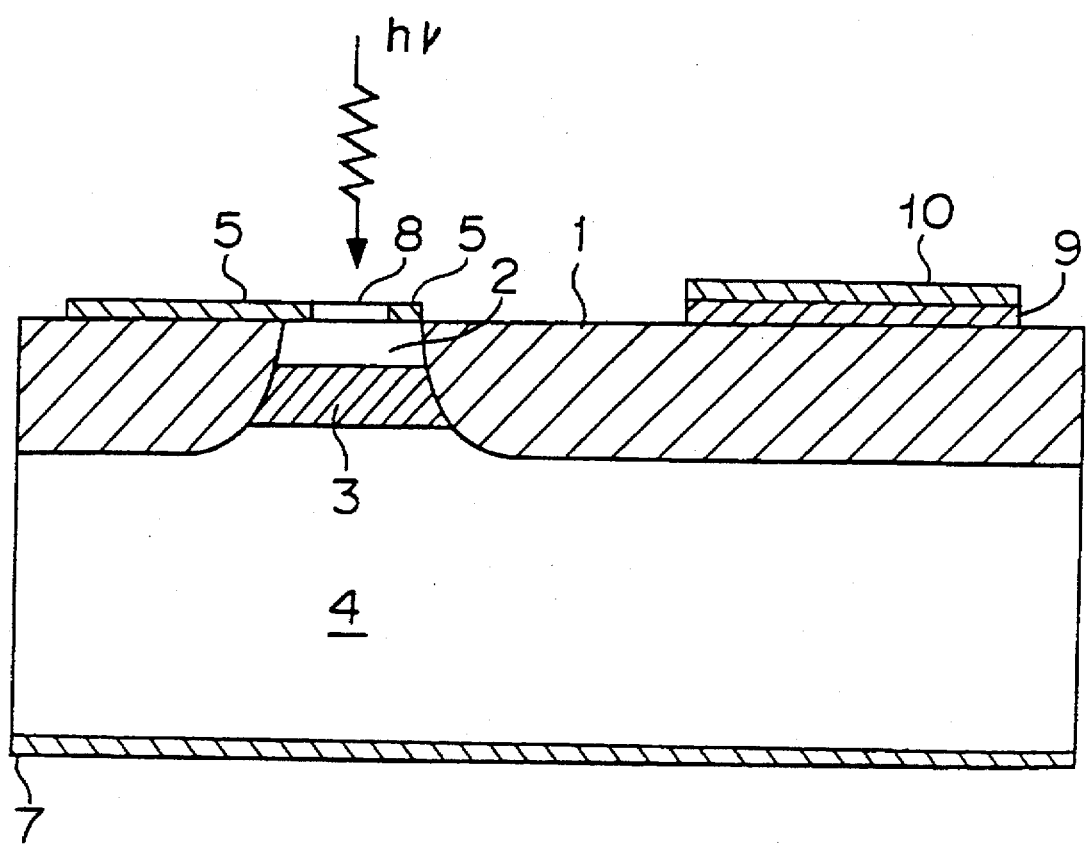
FIG. 1 is a cross-sectional view showing a photodiode according to a first embodiment of the present invention.

FIG. 1 is a cross-sectional view showing a photodiode according to a first embodiment of the present invention. In the FIG. 1, a numerical reference 9 designates a p-type InGaAs contact layer, and a numerical reference 10 designates a cathode-side electrode made of Ti/Au.

Figure 2:
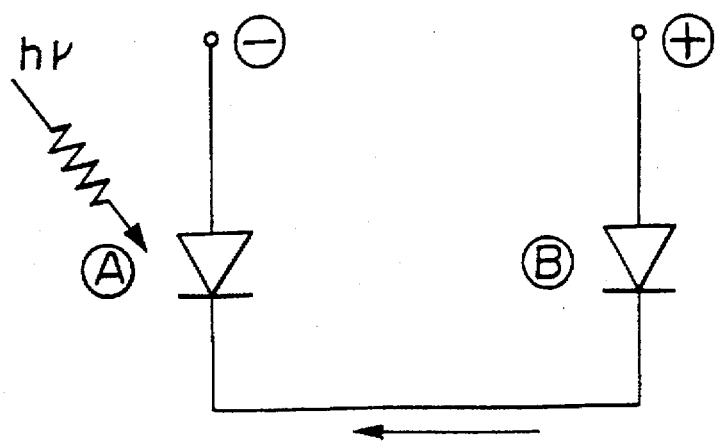
FIG. 2 is an equivalent circuit diagram of the photodiode according to the first embodiment of the present invention.
Figure 3:
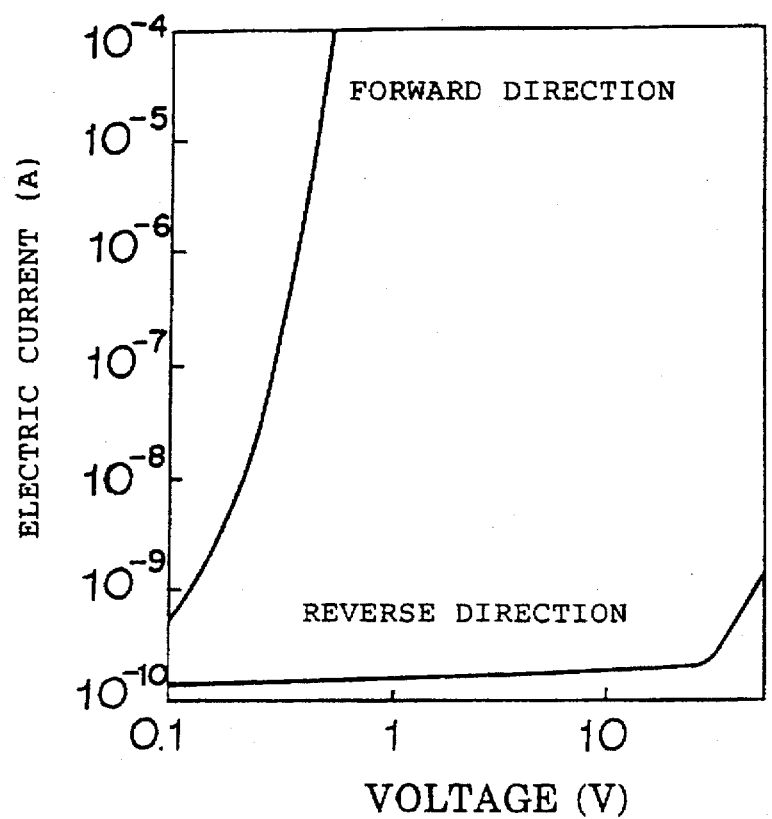
FIG. 3 is a diagram showing the voltage-current characteristic of a junction formed of p-type InGaAs, Inp doped with Fe, and n-type InGaAs.

The principle of operation of this embodiment is explained. FIG. 2 is an equivalent circuit diagram of the photodiode according to the first embodiment shown in FIG. 1. A diode A comprises a p-type InP window layer 2, an intrinsic-InGaAs light absorption layer 3 and an n-type InP substrate 4. A diode B comprises a p-type InGaAs contact layer 9, an InP layer doped with Fe 1 and the n-type InP substrate 4. The diodes A and B are connected via the n-type InP substrate 4. The reason why the junction comprising the p-type InGaAs, the InP doped with Fe, and the n-type InP works as a diode is that the InP doped with Fe has a characteristic of passing holes and blocking electrons. When holes are supplied from the p-type InGaAs contact layer 9, the holes pass through the InP layer doped with Fe 1 to reach the n-type InP substrate 4. Thus, an electrical current flows. In FIG. 3 showing a voltage-current characteristic of the junction comprising the p-type InGaAs, the InP doped with Fe, and the n-type InGaAs, the junction has the same rectifying characteristics as that of a diode.

The photodiode is used so that a bias voltage is applied to the p-n junction in a reverse direction. In the photodiode having the above-mentioned structure, a photo current is generated by introducing light into the diode A. The photo current tends to flow toward the electrode 5. At this time, the diode B does not prevent the flowing of the photo current because the diode B is arranged to biased in a forward direction to the photo current. As a result, the incidence of light causes the current flowing from the electrode 10 to the electrode 5. The function of a photodiode is thus achieved.

In the conventional structure, the cathode-side electrode 6 was formed by etching the InP layer doped with Fe 1 of about 5 μm thick. Accordingly, there existed a difference of level of more than 5 μm in the surface of the device. On the other hand, according to the present invention, there is a difference of level of only about 0.2 μm, which corresponds to the thickness of the p-type InGaAs contact layer 9, and the electrodes 5 and 10 are substantially flush. Therefore, the problem of the uneven coating of the resist can be solved, and mounting and succeeding processing is easier. Since the cathode-side electrode 10 can be located near the anode-side electrode 5, a large surface area is obtainable. In the conventional structure, different kinds of metal had to be used for the cathode and anode electrodes 5, 6. In this embodiment, however, the two electrodes 5, 10 can be formed simultaneously with the same kind of metallic material because the two electrodes 5, 10 on the front surface are ohmic electrodes to the p-type semiconductor. Further, the surge resistance can be improved since a current flows in the forward direction of the photodiode.

Embodiment 2

Figure 4:
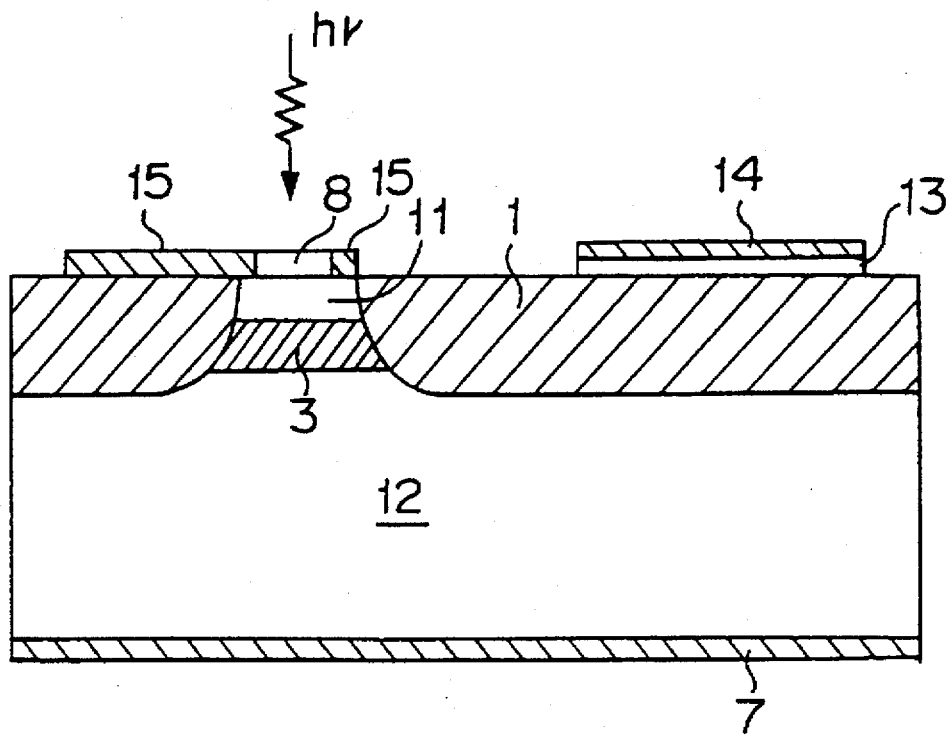
FIG. 4 is a cross-sectional view showing a photodiode according to a second embodiment of the photodiode present invention.
Figure 5:
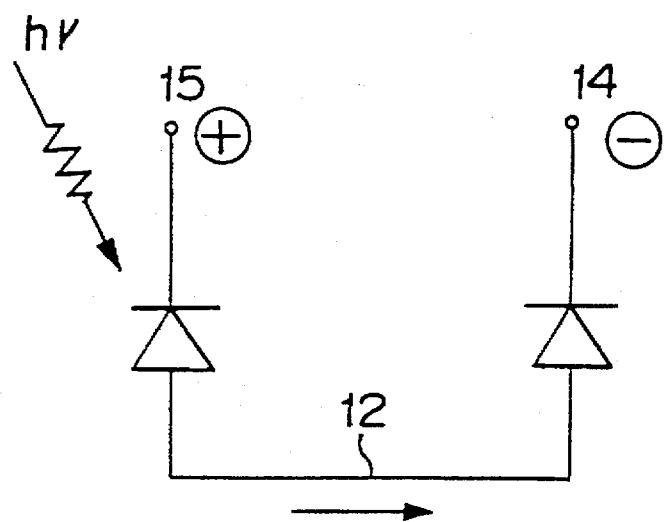
FIG. 5 is an equivalent circuit diagram of the photodiode according to the second embodiment of the present invention.

FIG. 4 shows a photodiode according to a second embodiment of the present invention. A numerical reference 11 designates an n-type InP window layer. A numerical reference 12 designates a p-type InP substrate. A numerical reference 13 designates an n-type InP contact layer. A numerical reference 14 designates an anode-side electrode made of Cr/Au. A numerical reference 15 designates a cathode-side electrode made of Cr/Au. The structure of this embodiment is same as that of Embodiment 1 except that the p-type and n-type elements are exchanged. The p-type InP substrate 12 supplies holes to the InP layer doped with Fe 1. FIG. 5 shows an equivalent circuit diagram for the second embodiment. The principle of operation is similar to that of the EMBODIMENT 1. The second embodiment can provide an effect similar to that of the Embodiment 1.

Embodiment 3

Figure 6:
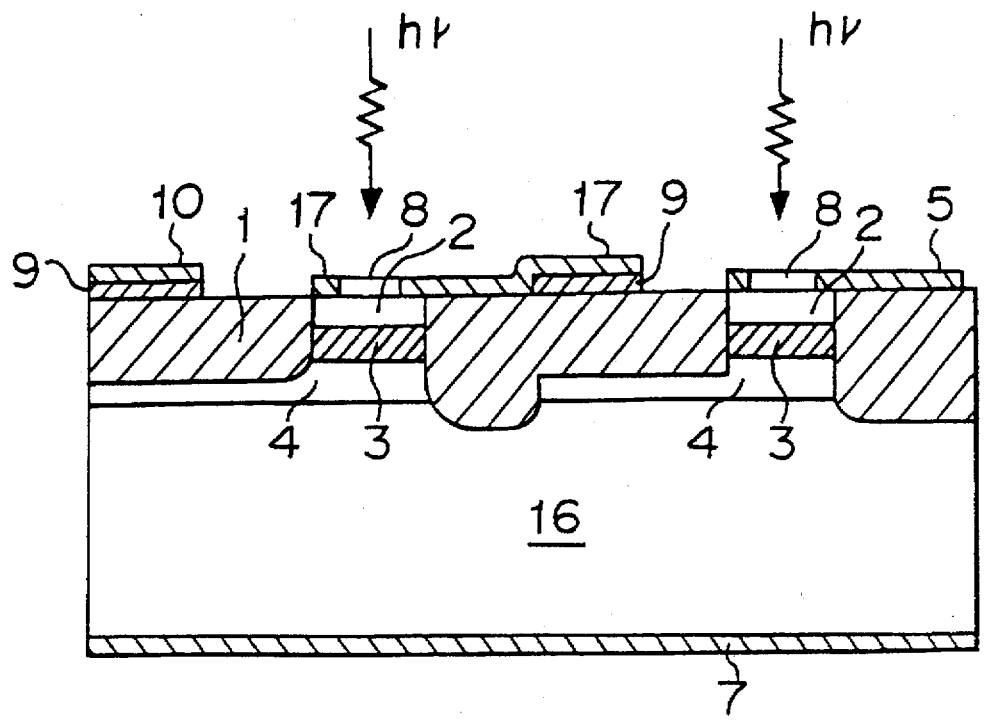
FIG. 6 is a cross-sectional view showing a photodiode for a balanced receiver according to a third embodiment of the present invention.
Figure 7:
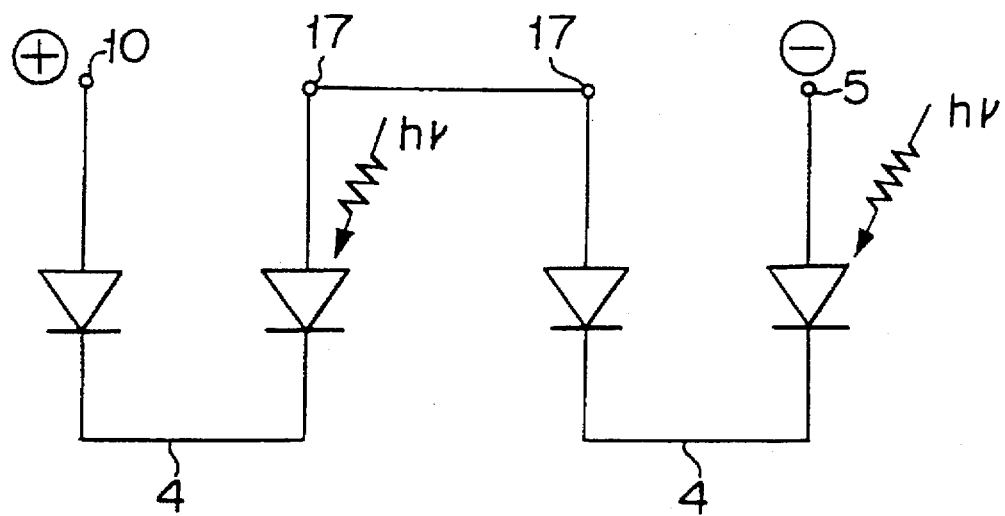
FIG. 7 is an equivalent circuit diagram of the photodiode according to the third embodiment of the present invention.

FIG. 6 is a cross-sectional view showing a balanced receiver to which a photodiode according to a third embodiment of the present invention is applied. In FIG. 6, a numerical reference 16 designates an InP substrate doped with Fe. A numerical reference 17 designates a Ti/Au electrode which connects a first photodiode with a second photodiode. FIG. 7 shows the equivalent circuit diagram.

In the following, the operation is explained. The balanced receiver has a circuit structure in which the photodiodes are connected in series and an electric current flows only when light enters simultaneously into the two photodiodes. In the balanced receiver to which the present invention is applied, the electrodes are substantially flush, and a difference in the surface level is small. An effect similar to that of the Embodiment 1 is obtainable.

Embodiment 4

Figure 8:
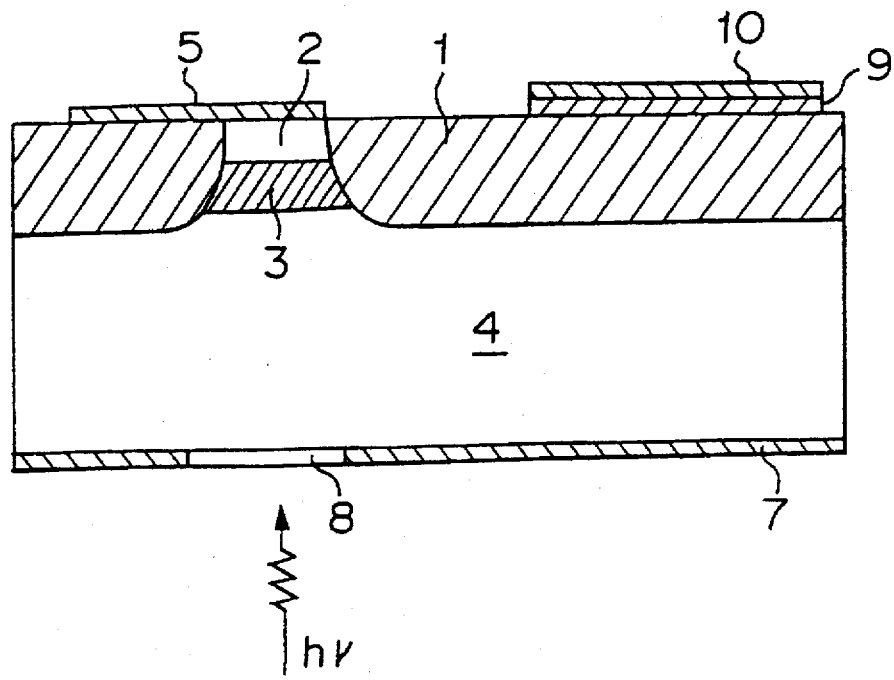
FIG. 8 is a cross-sectional view showing a back-incidence type photodiode according to a fourth embodiment of the present invention.

FIG. 8 is a cross-sectional view showing a back-incidence type photodiode according to a fourth embodiment of the present invention. The present invention is also applicable to a photodiode having a structure for receiving light from the side of substrate.

Embodiment 5

Figure 9:
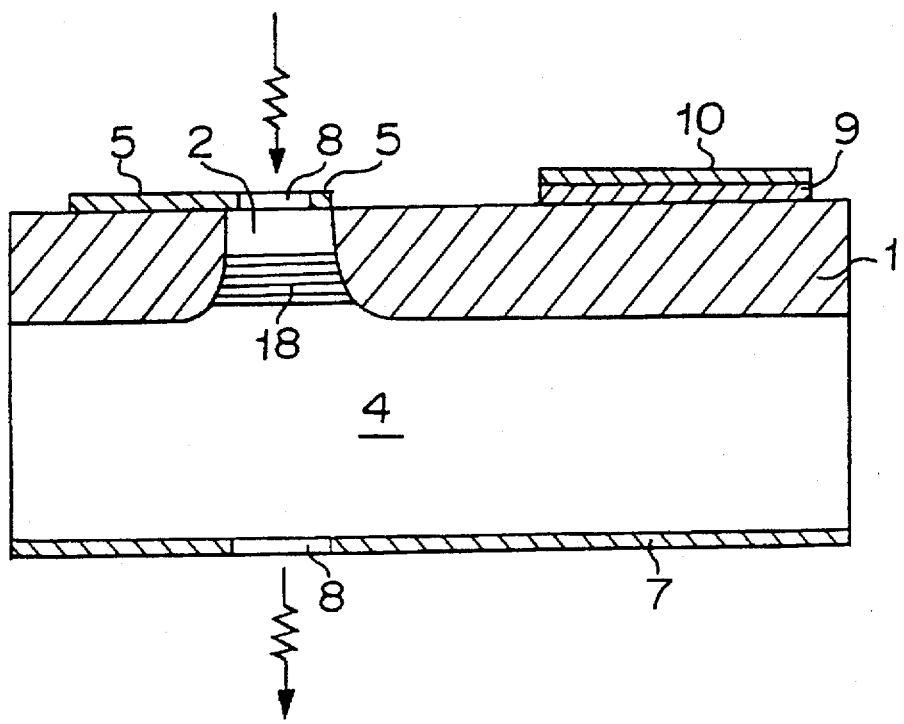
FIG. 9 is a cross-sectional view showing a semiconductor modulator according to a fifth embodiment of the present invention.

FIG. 9 is a cross-sectional view showing a semiconductor modulator of a plane-incidence type according to a fifth embodiment of the present invention. In FIG. 9, a numerical reference 18 designates an absorption layer (composed of intrinsic-InGaAs/InGaAsP) that is a multiple quantum well structure. When a voltage applied to the absorption layer 18 is changed, light transmission changes, with the result of modulating light intensity. The present invention is applicable to such modulator.

Embodiment 6

In this embodiment, the InP layer doped with Fe 1 used in the Embodiments 1-5 is changed to an InP layer doped with Co or an InP layer doped with V, which are the same type of electron trapping semi-insulating crystals, as a modification of the present invention.

Embodiment 7

Figure 10:
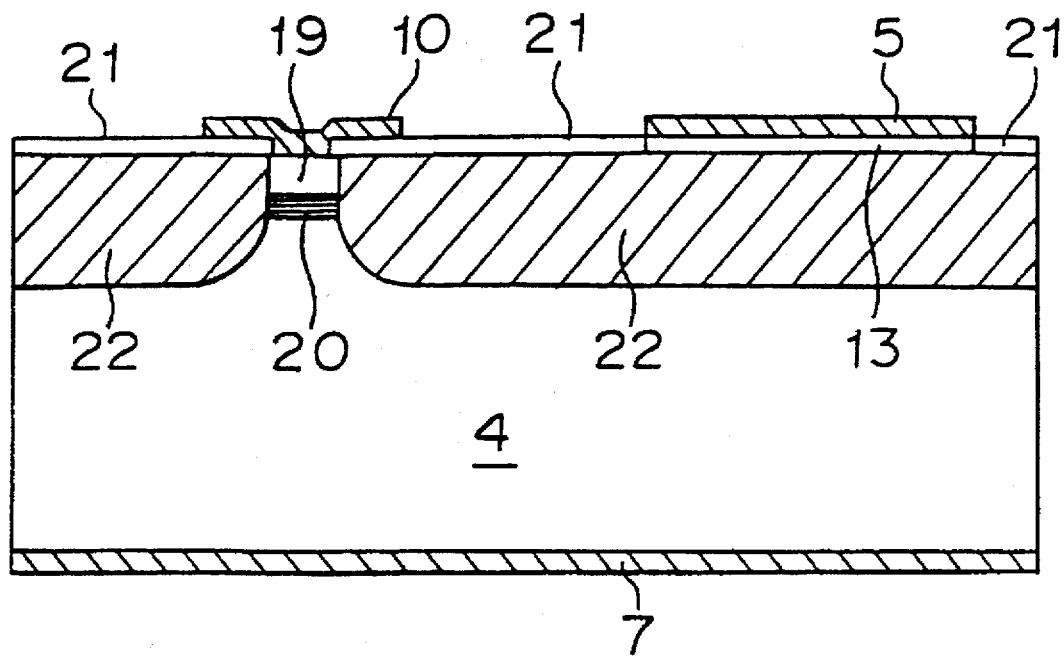
FIG. 10 is a cross-sectional view showing a semiconductor laser device according to a seventh embodiment of the present invention.
Figure 11:
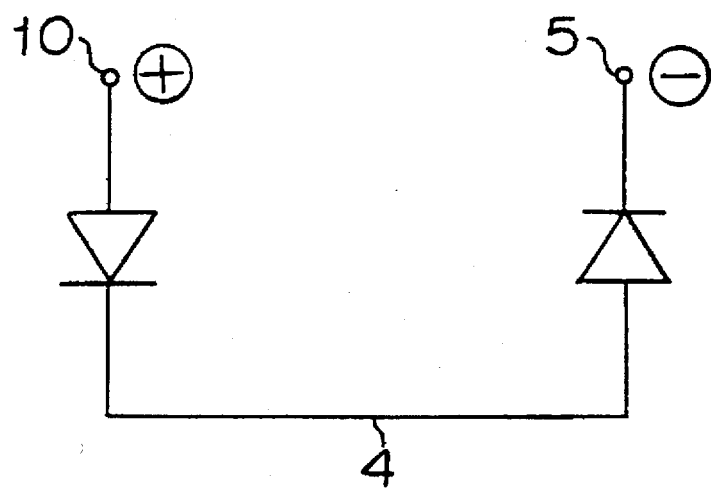
FIG. 11 is an equivalent circuit diagram of the semiconductor laser device according to the seventh embodiment of the present invention.

FIG. 10 is a cross-sectional view showing a semiconductor laser device according to the seventh embodiment of the present invention. In FIG. 10, a numerical reference 19 designates a p-type InP clad layer. A numerical reference 20 designates an active layer. A numerical reference 21 designates an insulating film of $SiO_2$. A numerical reference 22 designates an InP layer doped with Cr. In the semiconductor laser device, the InP layer doped with Cr is used instead of the InP layer doped with Fe for the photodiode. The reason is that when the semiconductor laser device is used, a bias voltage is applied to the p-n junction in the forward direction, whereas when the photodiode is used, a bias voltage is applied to it in the reverse direction. When the InP layer doped with Fe of Embodiment 1 is used for the semiconductor laser device of this embodiment, the application of a bias voltage in the forward direction results in holes leaking through the p-type InP cladding layer 19 to the InP layer doped with Fe and current does not flow into the active layer because the InP layer doped with Fe is a electron trapping semi-insulating material. Therefore, for the semiconductor laser device, when the InP layer doped with Cr 22, a hole trapping semi-insulating crystal which allows electrons to pass but blocks holes from passing, is used, the anode-side electrode 5 is on the n-type InP contact layer 13, and the cathode-side electrode 10 is on the p-type InP cladding layer 19. An equivalent circuit as shown in FIG. 11 is obtainable, wherein a current flows in the forward direction, and, laser light can be generated. In the semiconductor laser device according to the present invention, both electrodes can be formed with the same kind of material and at substantially the same level. A similar effect to that of the Embodiment 1 such as easy mounting in succeeding processing can be obtained. Further, the surge resistance is improved because a current does not flow in the reverse direction of the semiconductor laser device.

Embodiment 8

In the semiconductor laser device described as Embodiment 7, it is also possible to substitute an n-type InP cladding layer for a p-type InP cladding layer 19, to substitute a p-type InP substrate for an n-type InP substrate, and to substitute a p-type InP contact layer for an n-type InP contact layer 13, respectively.

Embodiment 9

The InP layer doped with Cr 22 of Embodiments 7 and 8 can be changed to the InP layer doped with Ti, a hole trapping semi-insulating crystal, as a modification of the present invention.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor optical device comprising:
   an n-type semiconductor substrate having front and back surfaces,
   a light absorption region in a portion of the n-type semiconductor substrate,
   a p-type window region disposed on the light absorption region in the n-type semiconductor substrate at the front surface,
   an electron trapping semi-insulating region in the n-type semiconductor substrate at the front surface and surrounding the light absorption region and the p-type window region, a p-type contact layer disposed on a portion of the semi-insulating region, a first electrode disposed on the p-type contact layer, and a second electrode disposed on the p-type window region and the semi-insulating region, wherein the first and second electrodes are substantially flush.

2. A photodiode incorporating the semiconductor optical device according to claim 1 for receiving light at the window region.

3. A photodiode incorporating the semiconductor optical device according to claim 1 for receiving light at the back surface of the semiconductor substrate.

4. A semiconductor optical device comprising:

a p-type semiconductor substrate having front and back surfaces, a light absorption region in a portion of the p-type semiconductor substrate, an n-type window region on the light absorption region in the p-type semiconductor substrate at the front surface, an electron trapping semi-insulating region in the p-type semiconductor substrate at the front surface and surrounding the light absorption region and the n-type window region, an n-type contact layer disposed on a portion of the semi-insulating region, a first electrode disposed on the n-type contact layer, and a second electrode disposed on the n-type window region and the semi-insulating region, wherein the first and second electrodes are substantially flush.

5. A photodiode incorporating the semiconductor optical device according to claim 4 for receiving light at the window region.

6. A photodiode incorporating the semiconductor optical device according to claim 4 for receiving light at the back surface of the semiconductor substrate.

* * * * *